United States Patent [19]

Bonaccio

[11] Patent Number: 5,532,619

[45] Date of Patent: Jul. 2, 1996

[54] PRECISION LEVEL SHIFTER W/CURRENT MIRROR

[75] Inventor: Anthony R. Bonaccio, Shelburne, Vt.

[73] Assignee: International Business Machines Corporation, Armonk, N.Y.

[21] Appl. No.: 356,816

[22] Filed: Dec. 15, 1994

[51] Int. Cl.⁶ .................................................. H03K 19/20
[52] U.S. Cl. ............................ 326/75; 326/124; 330/288
[58] Field of Search .............................. 326/75, 124, 89; 327/333, 490; 330/288, 257; 323/315

[56] References Cited

U.S. PATENT DOCUMENTS

| | | |
|---|---|---|
| 4,172,999 | 10/1979 | Leidich ................................. 330/288 |
| 4,692,641 | 9/1987 | Highton . |
| 4,714,871 | 12/1987 | Craft et al. . |
| 4,743,862 | 5/1988 | Scheinberg . |
| 4,767,946 | 8/1988 | Taylor . |
| 4,769,590 | 9/1988 | Taylor . |
| 4,883,988 | 11/1989 | Ide ...................................... 307/443 |
| 4,899,308 | 2/1990 | Khan . |
| 4,996,443 | 2/1991 | Tateno ................................. 327/333 |
| 5,039,886 | 8/1991 | Nakamura ........................... 330/257 |
| 5,148,118 | 9/1992 | Dobkin ................................ 330/288 |
| 5,304,869 | 4/1994 | Greason ............................... 330/257 |
| 5,349,287 | 9/1994 | Lorenz ................................. 330/288 |

*Primary Examiner*—Edward P. Westin
*Assistant Examiner*—Andrew Sanders
*Attorney, Agent, or Firm*—Schmeiser, Olsen & Watts; Richard M. Kotulak

[57] ABSTRACT

A level shifter circuit for converting an input signal referenced to the least positive power supply (typically ground) to an output signal referenced to a higher, more usable voltage. The level shifter circuit generally includes a current mirror arrangement for coupling first and second current legs. The first current leg includes an NPN bipolar transistor arranged in series with a resistor R and a PNP bipolar transistor, wherein the NPN and PNP transistors have base inputs $V_{ref}$ and $V_{in}$, respectively. The second current leg comprises a series arrangement of a diode-connected NPN bipolar transistor, a resistor R and a diode-connected NPN bipolar transistor. An output voltage ($V_{OUT}=V_{ref}-V_{in}$), is taken at the collector of the diode-connected NPN transistor in the second current leg.

13 Claims, 2 Drawing Sheets

PRECISION LEVEL SHIFTER W/CURRENT MIRROR

CROSS REFERENCE TO RELATED APPLICATIONS

Reference is hereby made to co-pending United States patent application Ser. No. 08/356,984 by Bonaccio (Bonaccio, BU9-94-125), entitled "Quad Burst Servo Demodulator with Adjustable Slew Rate for Hard Disk Drives," filed 12/15/1994 and assigned to the assignee of the present invention. The above-referenced, co-pending patent application is directed to a quad burst servo demodulator circuit which utilizes the precision level shifter of the present invention to shift the voltage on a storage capacitor to a higher voltage which is more easily processible by detection circuitry.

BACKGROUND OF THE INVENTION

1. Technical Field

The present invention relates generally-to a level shifter circuit and, more particularly, to a level shifter circuit for converting an input signal referenced to ground, or, more generally, the least positive power supply, to an output signal referenced to a higher, more usable voltage.

2. Background Art

In signal processing, it may become necessary to accurately process signals which can take on values close to the power supplies. Unfortunately, such processing requirements can create a problem because the transistors utilized in the signal processing circuits require signal-independent biasing that subtracts from the available supply voltage in determining the extreme limits of acceptable input signals (often. referred to as "headroom"). U.S. Pat. No. 4,767,946, "High-Speed Supply Independent Level Shifter," (issued August 1988 to Taylor and assigned to Tektronix, Inc.) discloses a level shifter which is designed to provide a supply independent input potential $V_1$ across the drive stage, given a required output potential $V_2$ to a subsequent stage. The level shifter is incorporated into a first current leg between first and second supply voltages. A second reference current leg is connected in parallel with the first current leg. A current mirror, coupling the first current leg to the second reference current leg, establishes a fixed relationship between the current flowing through each of the current legs. A floating voltage source $V_3$, which is an additive function of potentials $V_1$ and $V_2$, is designed to provide a desired $V_1$, given $V_2$, such that $V_1$ is independent of the supply voltages.

Other examples of level shifting circuits include U.S. Pat. No. 4,743,862, "JFET Current Mirror and Voltage Level Shifting Apparatus," (issued May 1988 to Scheinberg and assigned to Anadigics, Inc); U.S. Pat. No. 4,899,308, "High Density ROM in a CMOS Gate Array," (issued February 1990 to Khan and assigned to Fairchild Semiconductor Corp.); U.S. Pat. No. 4,692,641, "Level Shifting Circuitry for Serial-To-Parallel Converter," (issued September 1987 to Highton and assigned to Burr-Brown Corp.); U.S. Pat. No. 4,714,871, "Level Shifter for a Power Supply Regulator in a Television Apparatus," (issued December 1987 to Craft et al. and assigned to RCA Corp.); and U.S. Pat. No. 4,769,590, "Differential Level Shifter Employing Current Mirror," (issued September 1988 to Taylor and assigned to Tektronix, Inc.). All of the above-referenced patents are hereby incorporated herein by reference.

Although a wide variety of level shifting systems, such as those discussed above, have been developed to convert input and/or output signals to more appropriate, system dependent levels within signal processing circuits, currently available level shifting systems fail to address the problem solved by the instant invention, namely, the conversion of an input signal having a voltage close to the least positive power supply, to an output signal adjustably referenced to a higher, more easily usable voltage.

SUMMARY OF THE INVENTION

It is thus an object of the present invention to provide a level shifter circuit for translating an input signal having a voltage approaching the least positive power supply so that the input signal is referenced to a higher, more convenient voltage.

The foregoing and other objects of the present invention are achieved by a precision level circuit generally employing first and second current legs and a current mirror for producing substantially equal currents through the first and second current legs. The first current leg incorporates a series arrangement of an NPN bipolar transistor having a base input $V_{ref}$, a resistor R and a PNP bipolar transistor having a base input $V_{in}$. The second current leg includes a diode-connected NPN bipolar transistor arranged in series with a resistor R and a diode-connected PNP bipolar transistor. An output voltage $V_{out}$, measuring the voltage drop across the components in the second current leg, is taken at the collector of the diode-connected NPN bipolar transistor. Applying standard circuit analyzing techniques to the above described level shifter circuit, the output voltage $V_{OUT}$ is found to be:

$$V_{OUT}=V_{ref}-V_{in} \tag{1}$$

As should be readily apparent, the output voltage $V_{OUT}$ of the level shifter circuit inversely follows the input voltage $V_{in}$, offset by a predetermined reference voltage $V_{ref}$; $V_{out}$ decreases as $V_{in}$ increases. Accordingly, when the input voltage $V_{in}=0V$, $V_{out}=V_{ref}$.

BRIEF DESCRIPTION OF THE DRAWINGS

The foregoing and other objects, features and advantages of the present invention will be apparent from the following more particular description of the invention, as illustrated in the accompanying drawings.

DETAILED DESCRIPTION OF THE BEST MODE FOR CARRYING OUT THE INVENTION

Figure 1:
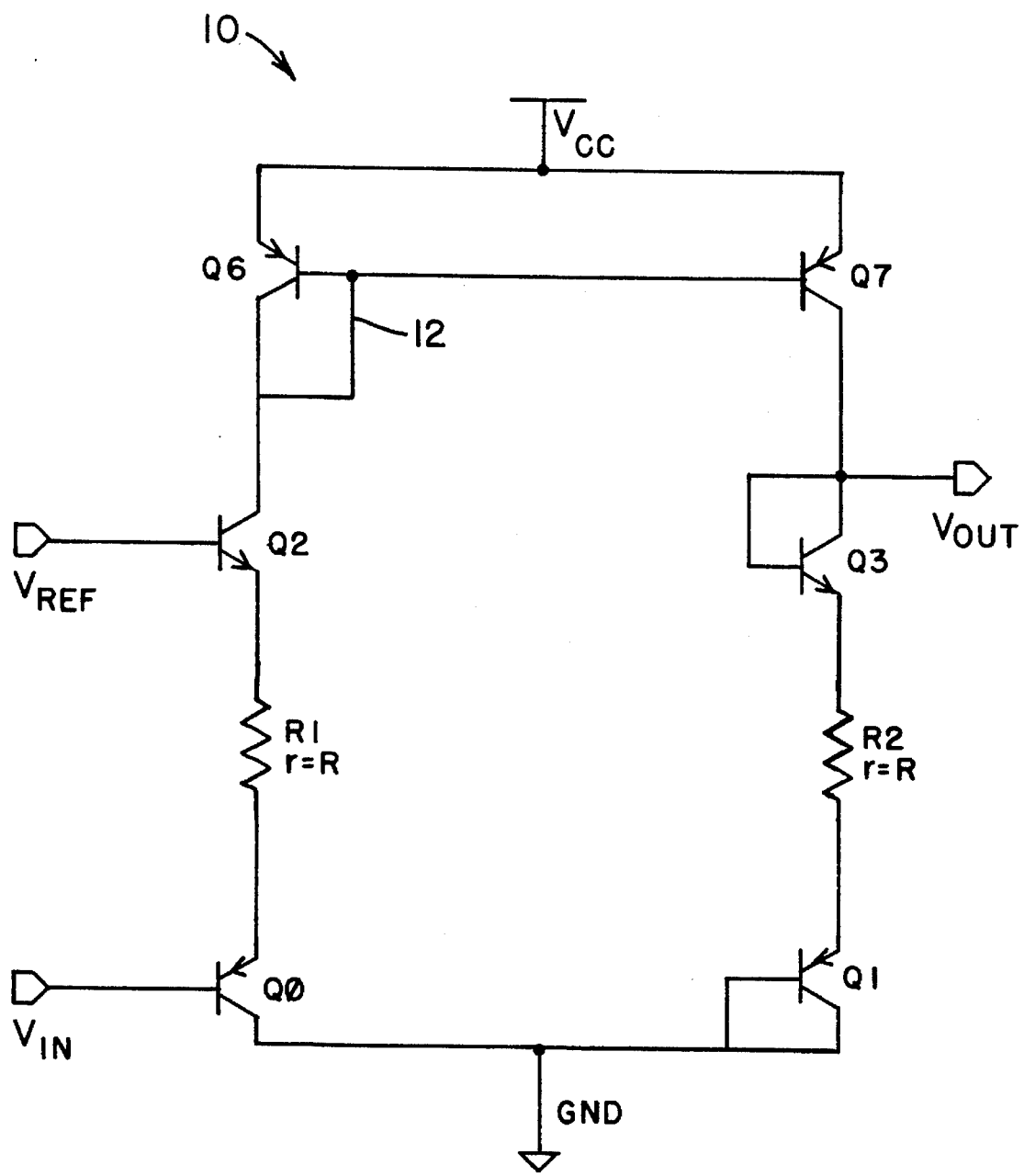
FIG. 1 is a circuit diagram of a first embodiment of a precision level shifter circuit in accordance with the present invention.

Referring now specifically to the FIG. 1, there is illustrated a precision level shifter circuit, generally designated as 10, in accordance with a first, simplified embodiment of the present invention, wherein like reference numerals refer to like components throughout the drawings. The first current leg of the level shifter circuit 10 includes a NPN bipolar transistor Q2 arranged in series with a biasing resistor $R_1$ and a PNP bipolar transistor Q0. An input voltage $V_{in}$ is applied to the base of transistor Q0, with the collector of transistor Q0 coupled to ground (gnd). The emitter of transistor Q2 is coupled through $R_1$ to the emitter of transistor Q0, thereby establishing a current path from the collector of transistor Q2 to ground.

The level shifter circuit 10 further includes a second current leg comprising a diode-connected NPN bipolar transistor Q3, connected in series with a biasing resistor $R_2$ and a diode-connected PNP bipolar transistor Q1 having its base and collector coupled to ground. The output voltage $V_{OUT}$ of the level shifter circuit 10 is taken at the collector of Q3.

The first and second current legs of the level shifter circuit 10 are joined by a current mirror arrangement comprising a pair of PNP bipolar transistors Q6 and Q7. As illustrated, transistors Q6 and Q7 are similarly biased by coupling their respective emitters to $V_{cc}$, and by connecting their respective bases to the collector of transistor Q2 via conductor 12.

Analyzing the first current leg of the level shifter circuit 10 illustrated in FIG. 1, the current $I_{co}$ in transistor Q0 is found to be dependent upon the input voltage $V_{in}$, the reference voltage $V_{ref}$ a and the value of $R_2$. Specifically:

$$I_{co} = \frac{(V_{ref} - V_{BE2}) - (V_{in} + V_{BE0})}{R_1} \quad (2)$$

Again, by analyzing the second current leg, noting that $I_{c3} \approx I_{co}$ due to the current mirror arrangement formed by transistors Q6 and Q7, the output voltage $V_{out}$ is equal to:

$$V_{out} = I_{co}R_2 + V_{BE1} + V_{BE3} \quad (3)$$

Substituting EQU. (2) into EQU. (3), given that $V_{BE0} \approx V_{BE1}$ and $V_{BE2} \approx V_{BE3}$ due to the complementary nature of the corresponding NPN and PNP bipolar transistors, and that $R_1 = R_2$:

$$V_{out} = V_{ref} - V_{in} \quad (4)$$

Advantageously, as set forth in EQU. (4), the level shifter circuit of the present invention converts an input voltage $V_{in}$, which may take on values approaching the least positive power supply (ground in FIG. 1), to a output voltage $V_{out}$ referenced to a higher, variable (variable $V_{ref}$), more usable voltage.

Further analysis of the level shifter circuit 10 illustrated in FIG. 1 clearly indicates that the operation of the circuit is also valid for input voltages down to approximately −0.5 V, limited only by the saturation of the PNP bipolar transistor Q0. Additionally, the input voltage $V_{in}$ can be allowed to increase to $V_{ref} - 2V_{BE}$, at which point $V_{out}$ ceases to decrease due to the turning off of transistors Q0 and Q2.

Although the simplified embodiment of the precision level shifter 10 of FIG. 1 may be adequately employed within a wide variety of systems, it ignores the effects of the finite forward current gain and output impedance of the bipolar junction transistors. This may create errors in the output voltage $V_{out}$ due to base current losses in transistor Q1 and inaccuracies in the current mirror arrangement formed by transistors Q6 and Q7. Further, the allowable upper range of the input voltage $V_{in}$ is restricted somewhat by practical values of $V_{ref}$. These problems are obviated by the level shifter circuit 20 illustrated in detail in FIG. 2. The level shifter circuit 20 is incorporated into the above-referenced quad burst sew o demodulator circuit to shift the voltage on a storage capacitor to a higher voltage which is more easily processible by detection circuitry. The level shifter circuit 20 generally includes first and second current legs coupled by a current mirror arrangement 22, a conventional 4-to-1 NFET multiplexer 24 and an input divider resistive network 26. As in the first embodiment of the present invention, the level shifter circuit 20 is designed to provide an output voltage given by:

$$V_{out} = V_{ref} - V_{in} \quad (5)$$

The first current leg of the level shifter circuit 20 includes a NPN bipolar transistor Q9 arranged in series with a biasing resistor $R_{35}$ and a PNP bipolar transistor Q27. An input voltage $V_{in}$, representing the voltage provided by the multiplexer 24 and the input divider resistive network 26, is applied to the base of transistor Q27. A variable reference voltage $V_{ref}$ is applied to the base of transistor Q9. A current path from the collector of transistor Q9 to ground is established by coupling the emitter of transistor Q9 to the emitter of transistor Q27 through $R_{35}$, and by connecting the collector of transistor Q27 to ground.

The second current leg generally includes a diode-connected NPN bipolar transistor Q13 connected in series with a biasing resistor $R_{34}$ ($R_{34} = R_{35}$) and a diode-connected PNP bipolar transistor Q2, with the output voltage $V_{OUT}$ of the level shifter circuit 20 taken at the collector of transistor Q13. The second current leg further includes resistor $R_{12}$, coupled between the collector and base of transistor Q13, and a variable resistor $R_{12}$, connected between the base of transistor Q2 and ground. The functions of resistors $R_{18}$ and $R_{12}$ will be described in greater detail hereinbelow.

The 4-to-1 NFET multiplexer 24 is conventional in construction and includes four primary NFET transistors N49, N38, N48, and N45, each having an input signal SCAP# and a gate controlled by a select signal SEL# (#=A, B, C or D). An additional NFET transistor N55 is utilized to selectively tie the output of the multiplexer 24 to ground. The current mirror arrangement 22 comprises a first pair of PNP bipolar transistors Q11, Q32, and a second pair of PNP bipolar transistors Q28, Q14. The emitters of transistors Q11 and Q32 are connected to $V_{cc}$ through identical resistors $R_{17}$ and $R_{25}$, respectively. Similarly, the emitters of transistors Q28 and Q14 are coupled to $V_{cc}$ through identical resistors $R_{31}$ and $R_{29}$, respectively. To achieve a current mirroring effect, the base inputs of transistors Q11, Q32, Q28 and Q14 are similarly biased via the source of a PFET buffer P5.

Figure 2:
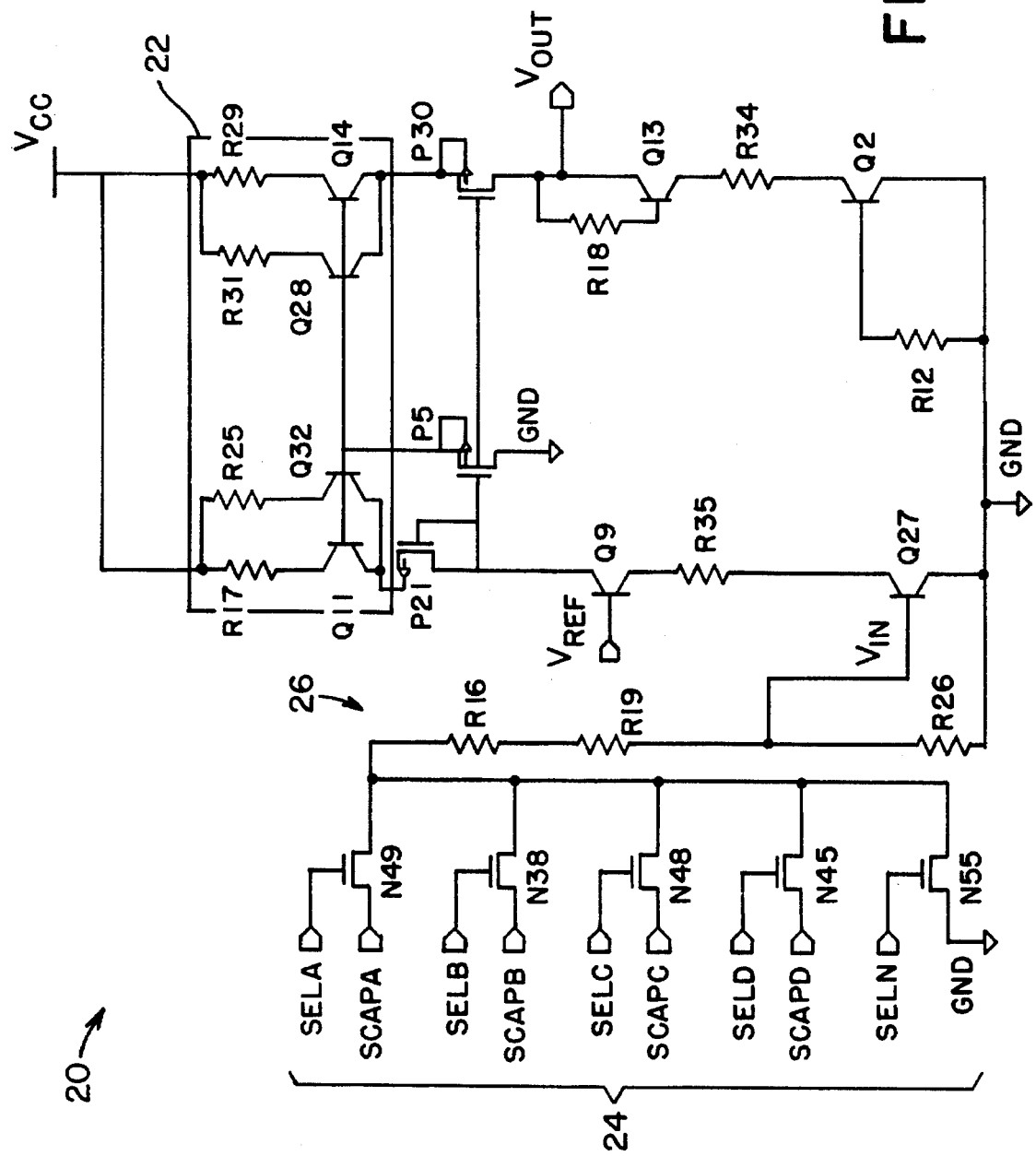
FIG. 2 is a circuit diagram of a second embodiment of a precision level shifter circuit in accordance with the present invention.

The accuracy of the current mirror arrangement 22 is increased, as compared to the current mirror arrangement formed by transistors Q6 and Q7 in FIG. 1, by utilizing the PFET buffer P5. As illustrated in FIG. 2, the gate of the PFET buffer P5 is coupled to the collector of transistor Q9, while the drain of the PFET buffer P5 is coupled to ground. Advantageously, by utilizing the PFET buffer P5, base current error is eliminated within the current mirror arrangement 22.

A pair of PFET cascodes P21 and P30 are utilized to increase the output resistance of the current mirror arrangement 22, thereby further improving accuracy. PFET cascode P21 is interposed between transistor Q9 and the first pair of PNP bipolar transistors Q11 and Q32 within the current mirror arrangement 22. The source of the PFET cascode P21 is coupled to the collectors of the current mirror transistors Q11 and Q32. The gate and drain of PFET cascode P21 are connected to the collector of transistor Q9 and the gate of the PFET buffer P5.

PFET cascode P30 is analogously interposed between transistor Q13 and the second pair of PNP bipolar transistors Q28 and Q14 forming the current mirror arrangement 22. Again, the source of PFET cascode P30 is coupled to the collectors of the current mirror transistors Q28 and Q14, while the drain of the PFET cascode P30 is connected to the collector of the transistor Q13. As with the PFET cascode P21, the gate of the PFET cascode P30 is coupled to the collector of the transistor Q9 and the gate of the PFET buffer P5.

The voltage error produced by the base current of transistor Q27 is compensated by the variable resistance of resistor $R_{12}$, which is connected between the base of transistor Q2 and ground. The resistance of resistor $R_{12}$ is adjustably set to the Thevenin equivalent resistance of the input divider resistive network 26, formed by variable resistors $R_{16}$, $R_{19}$ and $R_{26}$, plus any source impedance. Additionally, a FET (not shown) may be added in series with $R_{12}$ to replicate and compensate for the effects of the NFETs in the 4-to-1 NFET multiplexer 24.

Resistor $R_{18}$ is utilized to substantially compensate for the loss of a unit of base current through transistor Q9. Specifically, due to the finite forward current gain ($\beta$) of Q9, the current in $R_{35}$ is greater than the current in the collector of Q9. This error results in the output voltage $V_{out}$ being too low by one unit of base current times the value of resistor $R_{34}$. This is counteracted by dragging one unit of base current (the base current flowing into transistor Q13) through a resistor $R_{18}$ ($R_{18}=R_{34}$) and applying the associated voltage drop in series with the output chain formed by $R_{34}$ and transistor Q2.

While the invention has been particularly shown and described with reference to preferred embodiments thereof, it will be understood by those skilled in the art that the foregoing and other changes in form and details may be made therein without departing from the spirit and scope of the invention.

I claim:

1. A level shifter circuit comprising:

a first current path including a series arrangement of a first bipolar transistor having a base input voltage $V_{ref}$, and a second bipolar transistor having a base input voltage $V_{in}$;

a second current path including a first and a second bipolar transistor arranged in series and each arranged in a diode configuration; and a current arrangement for producing substantially identical currents through said first and second current paths, the current in said second current path producing an output voltage $V_{OUT}=V_{ref}-V_{in}$ across said second current path.

2. A level shifter circuit comprising:

a first current path including a series arrangement of a first bipolar transistor having a base input voltage $V_{ref}$, and a second bipolar transistor having a base input voltage $V_{in}$, wherein the second bipolar transistor within said first current path is a PNP bipolar transistor;

a second current path including first and second bipolar transistors arranged in series, wherein the second bipolar transistor within said second current path is a PNP bipolar transistor;

a current arrangement for producing substantially identical currents through said first and second current paths, the current in said second current path producing an output voltage $V_{OUT}=V_{ref}-V_{in}$ across said second current path.

3. The level shifter circuit according to claim 1, wherein said first and second current paths each further include a resistive member.

4. The level shifter circuit according to claim 3, wherein the resistive members within said first and second current paths provide equivalent resistances.

5. A level shifter circuit comprising:

a first current path including a series arrangement of a first bipolar transistor having a base input voltage $V_{ref}$, and a second bipolar transistor having a base input voltage $V_{in}$;

a second current path including first and second bipolar transistors arranged in series;

a first resistor coupled between a collector input and a base input of the first bipolar transistor in said second current path;

a second resistor coupled between a base input of the second bipolar transistor in said second current path and ground; and a current arrangement for producing substantially identical currents through said first and second current paths, the current in said second current path producing an output voltage $V_{OUT}=V_{ref}-V_{in}$ across said second current path.

6. A level shifter circuit comprising:

first and second current paths, said first current path including a first bipolar transistor having a base input voltage $V_{in}$ and a second bipolar transistor having a base input voltage $V_{ref}$, said second current path including a first and second transistor arranged in a diode configuration; and means for producing substantially equivalent currents through said first and second current paths, said current producing an output voltage $V_{OUT}=V_{ref}-V_{in}$ across said second current path.

7. The level shifter circuit according to claim 6, wherein said second current path includes a series arrangement incorporating the first transistor, a resistive member and the second transistor, and wherein said output voltage $V_{OUT}$ is taken across said series arrangement.

8. The level shifter circuit according to claim 7, further including:

a first resistor coupled between a collector input and a base input of the first transistor in said second current path; and a second resistor coupled between a base input of the second transistor in said second current path and ground.

9. The level shifter circuit according to claim 2, wherein the first and second bipolar transistors within said second current path are each arranged in a diode configuration.

10. The level shifter circuit according to claim 2, wherein said first and second current paths each further include a resistive member.

11. The level shifter circuit according to claim 5, wherein the first and second bipolar transistors within said second current path are-each arranged in a diode configuration.

12. The level shifter circuit according to claim 5, wherein said first and second current paths each further include a resistive member.

13. A level shifter circuit comprising:

a first current path including a series arrangement of a first NPN bipolar transistor having a base input voltage $V_{ref}$, and a second bipolar transistor having a base input voltage $V_{in}$;

a second current path including a first NPN bipolar transistor and a second bipolar transistor arranged in series; and a current arrangement for producing substantially identical currents through said first and second current paths, the current in said second current path producing an output voltage $V_{OUT}=V_{ref}-V_{in}$ across second current path.

\* \* \* \* \*